(12) United States Patent
Im et al.

(10) Patent No.: US 11,917,877 B2
(45) Date of Patent: *Feb. 27, 2024

(54) DISPLAY DEVICE WITH AUXILIARY ELECTRODE IN TRENCH

(71) Applicant: LG Display Co., Ltd., Seoul (KR)

(72) Inventors: Jonghyeok Im, Paju-si (KR); Hyoung-Su Kim, Paju-si (KR); Gyungmin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/151,862

(22) Filed: Jan. 9, 2023

(65) Prior Publication Data

US 2023/0165087 A1   May 25, 2023

Related U.S. Application Data

(63) Continuation of application No. 16/990,617, filed on Aug. 11, 2020, now Pat. No. 11,581,387.

(30) Foreign Application Priority Data

Dec. 30, 2019   (KR) .......................... 10-2019-0178089

(51) Int. Cl.
*H10K 59/131* (2023.01)
*H10K 50/84* (2023.01)
(Continued)

(52) U.S. Cl.
CPC ........... *H10K 59/131* (2023.02); *H10K 50/84* (2023.02); *H10K 50/856* (2023.02); *H10K 59/35* (2023.02); *H10K 59/38* (2023.02)

(58) Field of Classification Search
CPC ...... H10K 59/131; H10K 50/84; H10K 59/35; H10K 59/38; H10K 50/856
(Continued)

(56) References Cited

U.S. PATENT DOCUMENTS 10,283,571 B2   5/2019   Kim et al.
2013/0001612 A1*   1/2013   Lee .................. H10K 71/00
                                                          257/40
(Continued)

FOREIGN PATENT DOCUMENTS

DE    102016118494 A1    6/2017
EP    1505666 B1    4/2018
(Continued)

*Primary Examiner* — Xia L Cross
(74) *Attorney, Agent, or Firm* — Seed IP Law Group LLP (57) ABSTRACT

A display device includes a substrate provided with a plurality of pixels, a circuit element layer provided on the substrate and provided with an auxiliary electrode, an insulating layer provided on the circuit element layer and provided with a plurality of connection electrodes spaced apart from one another and a first trench, a fence structure provided on the plurality of connection electrodes, an organic light emitting layer provided on the fence structure, and a second electrode arranged on the organic light emitting layer, wherein the plurality of connection electrodes are electrically connected with the auxiliary electrode, at least one of the plurality of connection electrodes is exposed from the first trench, and the second electrode is in contact with a connection electrode exposed from the first trench. Therefore, a luminance difference between an outer portion of a panel and a center portion of the panel may be reduced.

8 Claims, 7 Drawing Sheets

(51) Int. Cl.
  *H10K 50/856* (2023.01)
  *H10K 59/35* (2023.01)
  *H10K 59/38* (2023.01)

(58) Field of Classification Search
  USPC .......................................................... 257/40
  See application file for complete search history.

(56) References Cited

U.S. PATENT DOCUMENTS

| | | |
|---|---|---|
| 2014/0131677 A1 | 5/2014 | Oh et al. |
| 2015/0008398 A1* | 1/2015 | Lee ...................... H10K 50/814 |
| | | 438/35 |
| 2016/0079334 A1 | 3/2016 | Lee et al. |
| 2016/0293888 A1 | 10/2016 | Shim et al. |
| 2017/0186831 A1* | 6/2017 | Nam .................... H10K 50/814 |
| 2018/0158878 A1 | 6/2018 | Lee et al. |
| 2019/0115561 A1 | 4/2019 | Tang et al. |
| 2020/0096676 A1 | 3/2020 | Ha et al. |
| 2021/0359025 A1* | 11/2021 | Jung .................... H10K 59/121 |

FOREIGN PATENT DOCUMENTS

| | | |
|---|---|---|
| EP | 3333926 A1 | 6/2018 |
| KR | 20190050460 A | 5/2019 |
| KR | 20190140241 A | 12/2019 |
| WO | 2019071711 A1 | 4/2019 |

* cited by examiner

DISPLAY DEVICE WITH AUXILIARY ELECTRODE IN TRENCH

CROSS-REFERENCE TO RELATED APPLICATION

This application is a continuation of U.S. patent application Ser. No. 16/990,617, filed Aug. 11, 2020, which claims the benefit and priority to Korean Application No. 10-2019-0178089, filed Dec. 30, 2019, in the Korean Intellectual Property Office, the disclosure of which is incorporated herein by reference.

BACKGROUND

Technical Field

The present disclosure relates to a display device displaying an image.

Description of the Related Art

With the advancement of the information age, the demand for a display device for displaying an image has increased with various forms. Therefore, various types of display devices such as a liquid crystal display (LCD) device, a light emitting display device, an organic light emitting display device, a micro light emitting display device, and a quantum dot light emitting display (QLED) device have been recently used.

For an organic light emitting display device, in the case that fine metal mask (FMM) technology is used to form red, green and blue pixels of an organic light emitting layer, it is possible to manufacture a small-to-medium panel by a mask shadow but it is difficult to apply a large area to this panel for a problem of sagging of a deposition mask. Therefore, a technology for forming an organic light emitting layer using a photo process based on a photoresist has been recently issued.

Meanwhile, a cathode electrode provided in an organic light emitting display device is arranged for all pixels as a common layer, and a cathode current supplied from an outer portion of a panel to the cathode electrode is deteriorated toward a center portion of the panel due to resistance of the cathode electrode, whereby a problem occurs in that a luminance difference occurs between the outer portion of the panel and a center portion of the panel.

BRIEF SUMMARY

The present disclosure has been made in view of the above problems, and the present disclosure provides a display device that may reduce a luminance difference between an outer portion of a panel and a center portion of the panel.

In accordance with one or more embodiments of the present disclosure, a display device is provided. The display device includes a substrate provided with a plurality of pixels, a circuit element layer provided on the substrate and provided with an auxiliary electrode, an insulating layer provided on the circuit element layer and provided with a plurality of connection electrodes spaced apart from one another and with a first trench, a fence provided on the plurality of connection electrodes, an organic light emitting layer provided on the fence, and a second electrode arranged on the organic light emitting layer, wherein the plurality of connection electrodes are electrically connected with the auxiliary electrode, at least one of the plurality of connection electrodes is exposed from the first trench, and the second electrode is in contact with a connection electrode exposed from the first trench.

In the display device according to the present disclosure, as the connection electrode exposed from the trench among the plurality of connection electrodes electrically connected with the auxiliary electrode is provided to be in contact with the second electrode, a luminance difference between an outer portion of a panel and a center portion of the panel may be reduced.

In addition to the effects of the present disclosure as mentioned above, additional features of the present disclosure will be clearly understood by those skilled in the art from the following description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have, and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,', 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may indirectly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the display device according to the present disclosure will be described in detail with reference to the accompanying drawings. Wherever possible, the same reference numbers will be used throughout the drawings to refer to the same or like parts.

Figure 1:
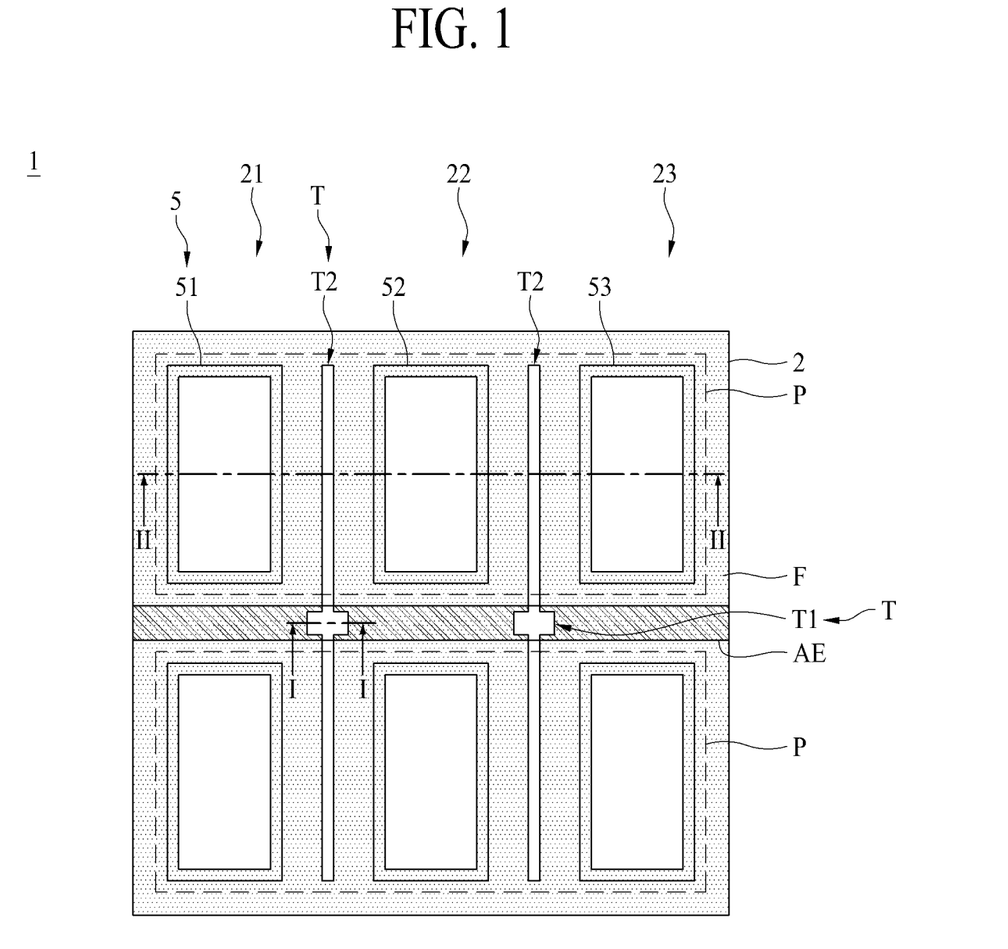
FIG. 1 is a plane view illustrating a display device according to one or more embodiments of the present disclosure.
Figure 2:
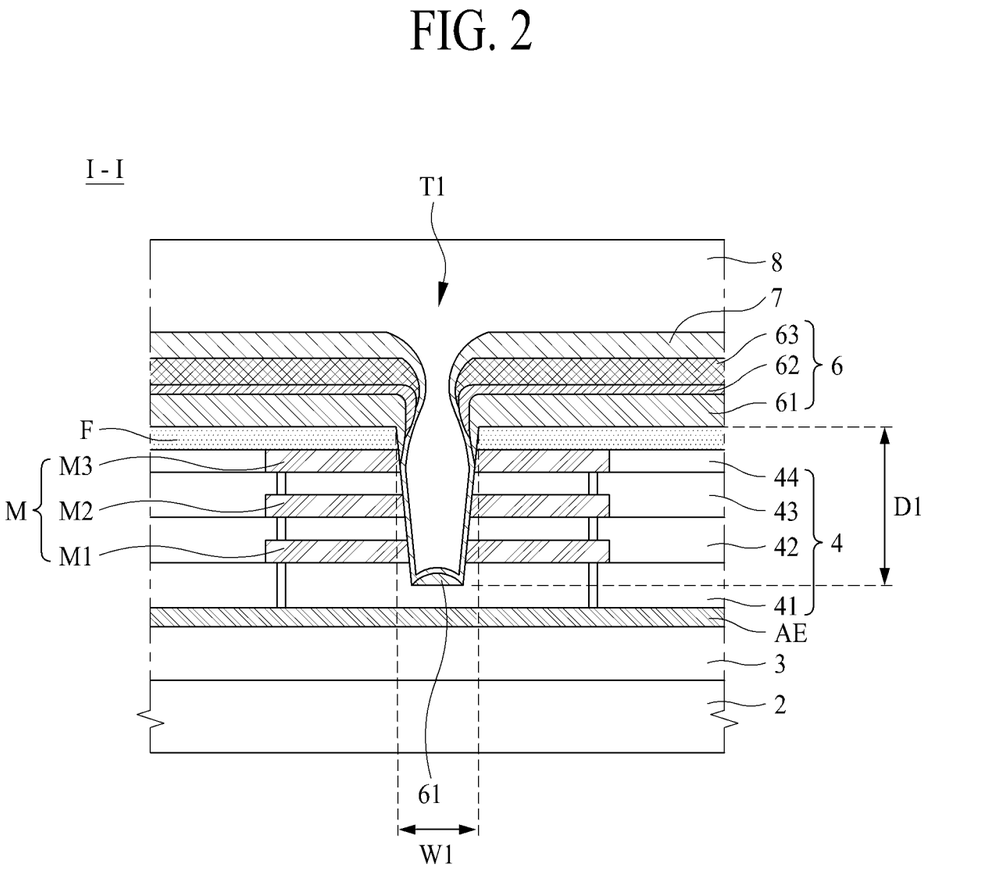
FIG. 2 is a cross-sectional view taken along line I-I shown in FIG. 1.
Figure 3:
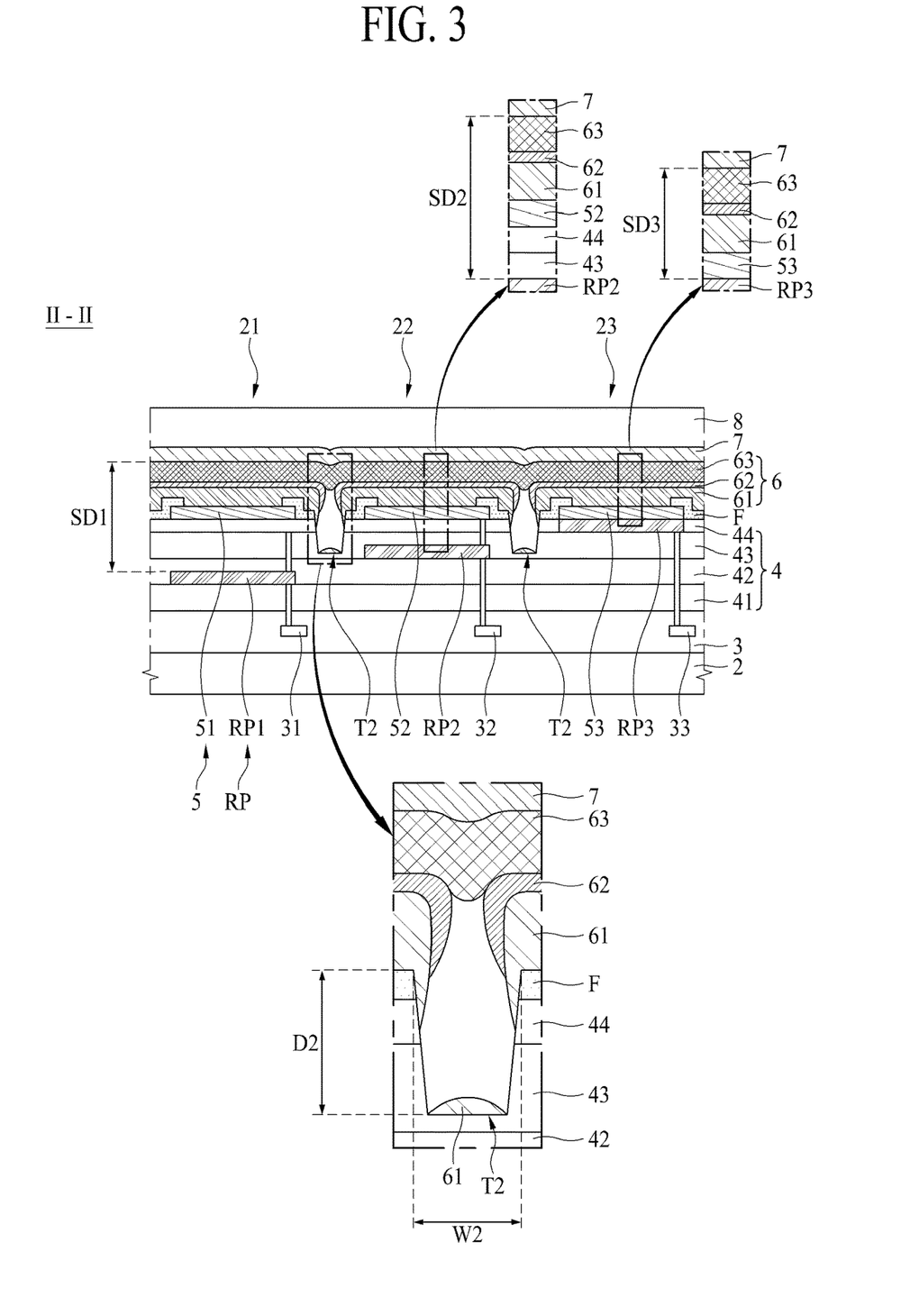
FIG. 3 is a cross-sectional view taken along line II-II shown in FIG. 1.

FIG. 1 is a plane view illustrating a display device according to one or more embodiments of the present disclosure, FIG. 2 is a cross-sectional view taken along line I-I shown in FIG. 1, and FIG. 3 is a cross-sectional view taken along line II-II shown in FIG. 1.

Referring to FIGS. 1 to 3, the display device 1 according to one or more embodiments of the present disclosure comprises a substrate 2, a circuit element layer 3, an auxiliary electrode AE, an insulating layer 4, a plurality of connection electrodes M, a reflective panel RP, a first electrode 5, a fence structure F (of a fence F), a trench T, an organic light emitting layer 6, a second electrode 7, and an encapsulation layer 8. The trench T may include a first trench T1 and a second trench T2. The first trench T1 according to one example may be arranged between a pixel P and an adjacent pixel P (such as a neighboring pixel), and the second trench T2 may be arranged in a boundary area among a first subpixel 21, a second subpixel 22 and a third subpixel 23 of the pixel P.

The substrate 2 may be a plastic film, a glass substrate, or a semiconductor substrate such as a silicon. The substrate 2 may be made of a transparent material or an opaque material. However, since the display device 1 according to some embodiments of the present disclosure is provided in a top emission method in which emitted light is emitted to a top portion, an opaque material may be used as a material of the substrate 2.

A plurality of pixels P may be provided on the substrate 2. The pixel P is an area where lights of various colors including white light are emitted, and lights of various colors emitted from the plurality of pixels P may be combined to make one image. As shown in FIG. 1, the plurality of pixels P may be arranged to be spaced apart from one another at a predetermined interval, and a plurality of first trenches T1 may be arranged between the respective pixels P.

The pixels P may include a first subpixel 21, a second subpixel 22 and a third subpixel 23, which are arranged on the substrate 2. The second subpixel 22 according to one example may be arranged to be adjacent to one side of the first subpixel 21. The third subpixel 23 according to one example may be arranged to be adjacent to one side of the second subpixel 22. Therefore, the first subpixel 21, the second subpixel 22 and the third subpixel 23 may sequentially be arranged on the substrate 2.

The first subpixel 21 may be provided to emit red (R) light, the second subpixel 22 may be provided to emit green (G) light, and the third subpixel 23 may be provided to emit blue (B) light, but these subpixels are not limited to this example and may emit lights of various colors including white light. Also, an arrangement sequence of the subpixels 21, 22 and 23 may be changed in various ways.

Each of the first subpixel 21, the second subpixel 22 and the third subpixel 23 may be provided to include the reflective panel RP, the first electrode 5, the organic light emitting layer 6, and the second electrode 7. The second trench T2 may be provided in a boundary area between the first subpixel 21 and the second subpixel 22 and a boundary area between the second subpixel 22 and the third subpixel 23.

The circuit element layer 3 is arranged on one surface of the substrate 2.

A circuit element including a plurality of thin film transistors 31, 32 and 33, various types of signal lines, and a capacitor is provided in the circuit element layer 3 per each of the subpixels 21, 22 and 23. The signal lines may include gate lines, data lines, power lines and reference lines, and the thin film transistors 31, 32 and 33 may include a switching thin film transistor, a driving thin film transistor, and a sensing thin film transistor. In one embodiment, the subpixels 21, 22 and 23 may be defined by a crossing structure of the gate lines, reference lines or reference voltage lines, power supply lines and the data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line and serves to supply the generated data current to the first electrode 5.

The sensing thin film transistor serves to sense a threshold voltage deviation of the driving thin film transistor, which is a cause of image degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

Referring to FIG. 3, a first thin film transistor 31, a second thin film transistor 32, and a third thin film transistor 33 are arranged in the circuit element layer 3 separately for each of the subpixels 21, 22 and 23.

The first thin film transistor 31 according to one example may be connected to a first sub electrode 51 arranged on the first subpixel 21 to apply a driving voltage for emitting light of a color corresponding to the first subpixel 21.

The second thin film transistor 32 according to one example may be connected to a second sub electrode 52 arranged on the second subpixel 22 to apply a driving voltage for emitting light of a color corresponding to the second subpixel 22.

The third thin film transistor 33 according to one example may be connected to a third sub electrode 53 arranged on the third subpixel 23 to apply a driving voltage for emitting light of a color corresponding to the third subpixel 23.

Each of the first subpixel 21, the second subpixel 22 and the third subpixel 23 according to one example supplies a predetermined current to the organic light emitting layer in accordance with the data voltage of the data line when a gate signal from the gate line is input thereto using each of the thin film transistors 31, 32 and 33. For this reason, the organic light emitting layer of each of the first subpixel 21, the second subpixel 22 and the third subpixel 23 may emit light with a predetermined brightness in accordance with the predetermined current. The auxiliary electrode AE (shown in FIG. 2) may be provided in the circuit element layer 3.

One function of the auxiliary electrode AE is to prevent voltage drop of the second electrode 7 from occurring. The auxiliary electrode AE may be made of a metal material. The auxiliary electrode AE may be connected to the second electrode 7 through at least one of the plurality of connection electrodes M and apply a voltage supplied from a voltage supply (not shown) to the second electrode 7 arranged at the center of the substrate 2. The voltage supply may be arranged outside the substrate 2 (or at an edge of the substrate 2) and therefore may be in contact with the auxiliary electrode AE.

The auxiliary electrode AE according to one example may be arranged between the pixel P and the adjacent pixel P and apply a cathode voltage applied from the voltage supply (not shown) to the second electrode 7. Therefore, the display device according to the present disclosure may prevent a luminance difference between the outside of the substrate 2 and the center of the substrate 2 from occurring by preventing the cathode voltage at the center of the substrate 2 spaced apart from the outside of the substrate 2 from being dropped.

The auxiliary electrode AE, as shown in FIG. 2, may be arranged on, but not limited to, an upper surface of the circuit element layer 3. That is, the auxiliary electrode AE may be arranged inside the circuit element layer 3. If the auxiliary electrode AE is arranged on the upper surface of the circuit element layer 3, the auxiliary electrode AE may electrically be connected to the connection electrode M provided in the insulating layer 4 through a separate contact electrode. If the auxiliary electrode AE is arranged inside the circuit element layer 3, the auxiliary electrode AE may electrically be connected to the connection electrode M through a contact electrode arranged in a contact hole provided in the circuit element layer 3 and a contact hole provided in the insulating layer 4. That is, the auxiliary electrode AE may electrically be connected to the connection electrode M and apply (or transfer) a cathode voltage supplied from the voltage supply to the connection electrode M.

The insulating layer 4 is provided on the upper surface of the circuit element layer 3.

The insulating layer 4 may be arranged between the first electrode 5 and the circuit element layer 3. The reflective panel RP and the plurality of connection electrodes M may be arranged inside or outside the insulating layer 4.

The reflective panel RP may be arranged in a position corresponding to the first to third subpixels 21, 22 and 23 to enhance light extraction efficiency of red light, green light and blue light. In more detail, the reflective panel RP reflects light emitted from the organic light emitting layer 6 of each of the subpixels 21, 22 and 23 toward the second electrode 7. As shown in FIG. 3, the reflective panel RP may include a first reflective panel RP1 arranged to overlap the first sub electrode 51, a second reflective panel RP2 arranged to overlap the second sub electrode 52 and a third reflective panel RP3 arranged to overlap the third sub electrode 53. The first to third reflective panels RP1, RP2 and RP3 may be made of Ag or a metal material that includes Ag. The first to third reflective panels RP1, RP2 and RP3 may respectively be connected to the first to third thin film transistors 31, 32 and 33 and the first to third sub electrodes 51, 52 and 53 through a separate contact electrode, whereby a driving voltage supplied from each of the first to third thin film transistors 31, 32 and 33 may be applied (or transferred) to each of the first to third sub electrodes 51, 52 and 53.

The first reflective panel RP1, the second reflective panel RP2 and the third reflective panel RP3 may respectively be formed to have a width the same as or greater than that of the first sub electrode 51, the second sub electrode 52 and the third sub electrode 53, whereby the light emitted from the organic light emitting layer 6 may be shielded from progressing toward the substrate 2.

At least one of the plurality of connection electrodes M may be arranged to adjoin the first trench T1 (or to be exposed to the first trench T1). That is, the plurality of connection electrodes M may be arranged between the pixel P and the adjacent pixel P like the first trench T1. Therefore, the plurality of connection electrodes M are not arranged inside the first to third subpixels 21, 22 and 23. The plurality of connection electrodes M may electrically be connected with the auxiliary electrode AE through a separate contact electrode.

The plurality of connection electrodes M applies (or transfers) the cathode voltage applied (or transferred) from the auxiliary electrode AE to the second electrode 7. The plurality of connection electrodes M may be provided in the insulating layer 4. The connection electrodes M according to one example may be arranged inside the insulating layer 4 and on an upper surface of the insulating layer 4. The plurality of connection electrodes M may be arranged to be spaced apart from one another in an up and down direction. In this case, the up and down direction is a direction where the fence F and the substrate 2 are arranged, wherein a direction toward the fence F may be an up direction and a direction toward the substrate 2 may be a down direction. The up and down direction may mean a second direction orthogonal to a first direction if the direction where the first subpixel 21, the second subpixel 22 and the third subpixel 23 are arranged is the first direction. Therefore, as shown in FIG. 2, the plurality of connection electrodes M may be arranged to be spaced apart from one another in a direction from the inside of the insulating layer toward the upper surface of the insulating layer 4.

A width of each of the plurality of connection electrodes M may be provided to be narrower than that of the reflective panel RP arranged in the subpixel. If the width of each of the plurality of connection electrodes M is the same as or wider than that of the reflective panel RP, the connection electrode M to which the cathode voltage is applied (or transferred) becomes too close to the first electrode 5 arranged in the subpixel, whereby short may occur. Therefore, the width of each of the plurality of connection electrodes M may be provided to be narrower than that of the reflective panel RP arranged in the subpixel. That is, the width of the reflective panel RP may be provided to be wider than that of each of the plurality of connection electrodes M.

Meanwhile, the plurality of connection electrodes M may include a first connection electrode M1, a second connection electrode M2 and a third connection electrode M3. The first connection electrode M1 may be arranged inside the insulating layer 4. The third connection electrode M3 may be arranged on the upper surface of the insulating layer 4. The second connection electrode M2 may be arranged inside the insulating layer 4 to be located between the first connection electrode M1 and the third connection electrode M3. Therefore, as shown in FIG. 2, the first connection electrode M1, the second connection electrode M2 and the third connection electrode M3 may be arranged in a line up and down while being spaced apart from one another.

The reason why the first connection electrode M1, the second connection electrode M2 and the third connection electrode M3 are spaced apart from one another is that each of the first connection electrode M1, the second connection electrode M2 and the third connection electrode M3 is formed of the same material as that of each of the first reflective panel RP1, the second reflective panel RP2 and the third reflective panel RP3 on the same layer.

First of all, the first to third reflective panels RP1, RP2 and RP3 reflects light and therefore may be made of a metal material, and the first to third connection electrodes M1, M2 and M3 applies the cathode voltage and therefore may be made of a metal material. Consequently, the first to third reflective panels RP1, RP2 and RP3 and the first to third connection electrodes M1, M2 and M3 may be made of the same material. Although it has been described that the first to third reflective panels RP1, RP2 and RP3 and the first to third connection electrodes M1, M2 and M3 are made of the metal material, the first to third reflective panels RP1, RP2 and RP3 and the first to third connection electrodes M1, M2 and M3 may be made of another material, which may apply a voltage while reflecting light, without limitation to the metal material.

Then, as shown in FIG. 3, the first reflective panel RP1 may be arranged inside the insulating layer 4, the third reflective panel RP3 may be arranged on the upper surface of the insulating layer 4, and the second reflective panel RP2 may be arranged inside the insulating layer 4 to be located between the first reflective panel RP1 and the third reflective panel RP3. That is, based on FIG. 3, a first distance SD1 where the first reflective panel RP1 is spaced apart from the second electrode 7 may be longer than a second distance SD2 where the second reflective panel RP2 is spaced apart from the second electrode 7, and the second distance SD2 is longer than a third distance SD3 where the third reflective panel RP3 is spaced apart from the second electrode 7. The reason why the first distance SD1, the second distance SD2 and the third distance SD3 become short in due order is to extract light of different colors by using microcavity characteristic.

The microcavity characteristic means that reinforcing interference occurs to amplify light if a distance between the first to third reflective panels RP1, RP2 and RP3 and the second electrode 7 reaches an integer multiple of a half wavelength $\lambda/2$ of light emitted from each of the subpixels 21, 22 and 23 and an amplified level of light is continuously increased to improve external extraction efficiency of light if reflection and re-reflection are repeated. Since the display device 1 according to one embodiment of the present disclosure is provided to have the microcavity characteristic, the second electrode 7 may include a semi-transparent electrode.

Meanwhile, since light extraction efficiency of a long wavelength may be improved if a spaced distance between the reflective panel RP and the second electrode 7 becomes long, light extraction efficiency of red light in the first distance SD1 may be improved. Since light extraction efficiency of a short wavelength may be improved if a spaced distance between the reflective panel RP and the second electrode 7 becomes short, light extraction efficiency of blue light in the third distance SD3 may be improved. Since the second distance SD2 is shorter than the first distance SD1 and longer than the third distance SD3, light extraction efficiency of green light may be improved.

Light extraction efficiency of red light may be improved due to the first distance SD1 where an upper surface of the first reflective panel RP1 is spaced apart from a lower surface of the second electrode 7, whereby the red light may be emitted from the first subpixel 21. Light extraction efficiency of green light may be improved due to the second distance SD2 where an upper surface of the second reflective panel RP2 is spaced apart from the lower surface of the second electrode 7, whereby the green light may be emitted from the second subpixel 22. Light extraction efficiency of blue light may be improved due to the third distance SD3 where an upper surface of the third reflective panel RP3 is spaced apart from the lower surface of the second electrode 7, whereby the blue light may be emitted from the third subpixel 23.

Consequently, the display device 1 according to one embodiment of the present disclosure may be provided to emit light of different colors per first to third subpixels 21, 22 and 23 without a color filter because light extraction efficiency of different colors per first to third subpixels 21, 22 and 23 may be improved using the microcavity characteristic.

In order to obtain the microcavity effect as above, the first reflective panel RP1 is arranged inside the insulating layer 4, the third reflective panel RP3 is arranged on the upper surface of the insulating layer 4, and the second reflective panel RP2 is arranged inside the insulating layer 4 to be located between the first reflective panel RP1 and the third reflective panel RP3. Therefore, the first connection electrode M1 formed simultaneously with the first reflective panel RP1 may be arranged inside the insulating layer 4, the third connection electrode M3 formed simultaneously with the third reflective panel RP3 may be arranged on the upper surface of the insulating layer 4, and the second connection electrode M2 formed simultaneously with the second reflective panel RP2 may be arranged inside the insulating layer 4 to be located between the first connection electrode M1 and the third connection electrode M3. Therefore, the first connection electrode M1, the second connection electrode M2 and the third connection electrode M3 may be arranged to be spaced apart from one another at a predetermined interval. For example, each of the spaced interval between the first connection electrode M1 and the second connection electrode M2 and the spaced interval between the second connection electrode M2 and the third connection electrode M3 may be provided to be 1000 Å or less. As a result, the first connection electrode M1, the second connection electrode M2 and the third connection electrode M3 may be made of the same material on the same layer like the first reflective panel RP1, the second reflective panel RP2 and the third reflective panel RP3 except that they are arranged between the pixel P and the adjacent pixel P and respectively provided to have a width shorter than that of each of the first reflective panel RP1, the second reflective panel RP2 and the third reflective panel RP3.

Meanwhile, the insulating layer 4 may include a first insulating layer 41, a second insulating layer 42, a third insulating layer 43 and a fourth insulating layer 44.

The first reflective panel RP1 and the first connection electrode M1 may be arranged on the upper surface of the first insulating layer 41, the second reflective panel RP2 and the second connection electrode M2 may be arranged on the upper surface of the second insulating layer 42, and the third reflective panel RP3 and the third connection electrode M3 may be arranged on the upper surface of the third insulating layer 43. Sides of the third reflective panel RP3 and the third connection electrode M3 may be in contact with the fourth insulating layer 44.

A manufacturing process of the first to third reflective panels RP1, RP2 and RP3 and the first to third connection electrodes M1, M2 and M3 is as follows.

First of all, the first insulating layer 41 is fully deposited on the upper surface of the circuit element layer 3.

Next, a metal material constituting the first reflective panel RP1 and the first connection electrode M1 is fully deposited on the upper surface of the first insulating layer 41 and then the first reflective panel RP1 is formed by being patterned to correspond to the first subpixel 21 through a photo process and an etching process and the first connection electrode M1 is formed by being patterned to be arranged between the pixel P and the adjacent pixel P while having a width smaller than that of the first reflective panel RP1.

Then, the second insulating layer 42 is fully deposited to cover the first reflective panel RP1, the first connection electrode M1 and the upper surface of the first insulating layer 41.

Next, a metal material constituting the second reflective panel RP2 and the second connection electrode M2 is fully deposited on the upper surface of the second insulating layer 42 and then the second reflective panel RP2 is formed by being patterned to correspond to the second subpixel 22 through a photo process and an etching process and the second connection electrode M2 is formed by being patterned to be arranged between the pixel P and the adjacent pixel P while having a width smaller than that of the second reflective panel RP2.

Then, the third insulating layer 43 is fully deposited to cover the second reflective panel RP2, the second connection electrode M2 and the upper surface of the second insulating layer 42.

Next, a metal material constituting the third reflective panel RP3 and the third connection electrode M3 is fully deposited on the upper surface of the third insulating layer 43 and then the third reflective panel RP3 is formed by being patterned to correspond to the third subpixel 23 through a photo process and an etching process and the third connection electrode M3 is formed by being patterned to be arranged between the pixel P and the adjacent pixel P while having a width smaller than that of the third reflective panel RP3.

Then, the fourth insulating layer 44 is fully deposited to cover the third reflective panel RP3, the third connection electrode M3 and the upper surface of the third insulating layer 43. An etching process may be performed for the entire surface until the upper surface of the third reflective panel RP3 and the upper surface of the third connection electrode M3 are exposed, whereby the fourth insulating layer 44 may be provided to be in contact with the sides of the third reflective panel RP3 and the third connection electrode M3.

Through the aforementioned manufacturing process, the first and second reflective panels RP1 and RP2 and the first and second connection electrodes M1 and M2 may be formed inside the insulating layer 4, and the third reflective panel RP3 and the third connection electrode M3 may be formed on the upper surface of the insulating layer 4.

Although the process of manufacturing a contact electrode for connecting the thin film transistors 31, 32 and 33, the first electrode 5 and the reflective panel RP with one another and a contact electrode for connecting the auxiliary electrode AE with the connection electrodes M1, M2 and M3 has been omitted in the aforementioned manufacturing process, the contact electrode may be formed in the insulating layer 4 through a photo process and an etching process.

Referring to FIGS. 1 and 2 again, the first trench T1 contacts the second electrode 7 with the auxiliary electrode AE through the plurality of connection electrodes M. The first trench T1 may be arranged between the plurality of pixels P. The first trench T1 may be provided to be smaller than the spaced interval of the pixels P and therefore arranged to be spaced apart from the pixels P at a predetermined distance. If the first trench T1 is greater than the spaced interval of the pixels P, a size of a light emitting area relatively becomes small, whereby overall light emitting efficiency may be deteriorated.

The first trench T1 may be formed in such a manner that after the first electrode 5 is formed on the fourth insulating layer 44 per subpixels 21, 22 and 23, the fence F is fully deposited to cover the first electrode 5 and the upper surface of the fourth insulating layer 44 which is not covered by the first electrode 5 and then each of the fence F arranged between the pixel P and the adjacent pixel P, the plurality of connection electrodes M and the insulating layer 4 is partially removed by being patterned through a photo process and an etching process. Therefore, the sides of the first connection electrode M1, the second connection electrode M2 and the third connection electrode M3, which are arranged up and down, may be exposed from the inside of the first trench T1.

Meanwhile, since the etching process for forming the first trench T1 is performed from up to down, the removed area of the third connection electrode M3 arranged at an upper side may be greater than the removed area of the first connection electrode M1 arranged at a lower side. Since this may equally be applied to the insulating layer 4, as shown in FIG. 2, a side of the first trench T1 may be formed to be inclined, and a width of the first trench T1 may be narrow from up to down.

The organic light emitting layer 6 is deposited on the entire surface after the first trench T1 is formed. The organic light emitting layer 6 may be inserted into the first trench T1 while covering an upper surface of the fence F, thereby partially covering the side of the first trench T1. Therefore, the organic light emitting layer 6 may partially or fully cover the side of the third connection electrode M3 arranged at the uppermost side of the first trench T1, and at least one of the side of the second connection electrode M2 and the side of the first connection electrode M1 may be exposed to the outside. At least one of the sides of the first connection electrode M1, the second connection electrode M2 and the third connection electrode M3, which are exposed to the outside, is in contact with the second electrode 7 deposited during a later process, whereby the cathode voltage applied through the auxiliary electrode AE and the plurality of connection electrodes M may be applied to the second electrode 7 arranged at the center of the substrate 2.

Referring to FIG. 2 again, the organic light emitting layer 6 may be disconnected from the first trench T1 due to the width W1 of the first trench T1. At least a portion of a first stack 61, a charge generation layer 62 and a second stack 63 of the organic light emitting layer 6 may be formed on a lower surface (or bottom) of the first trench T1.

As described above, since the organic light emitting layer 6 is disconnected from the first trench T1, the second electrode 7 deposited during a later process, as shown in FIG. 2, may be inserted into the first trench T1, and therefore may be in contact with the connection electrode M exposed from the side of the first trench T1. The second electrode 7 may be provided to cover the organic light emitting layer 6 formed on the lower surface (or bottom) of the first trench T1, and therefore may be provided as a common layer without being disconnected on the substrate 2.

Although FIG. 2 shows that the fence F is arranged on the upper surface of the third connection electrode M3, the first electrode 5 may be arranged between the third connection electrode M3 and the fence F. However, in this case, this first electrode 5 may be disconnected without being connected with the first electrode 5 arranged in the subpixels 21, 22 and 23. This is because that the cathode voltage supplied to the connection electrode M and an anode voltage supplied per subpixels 21, 22 and 23 may be shorted if the first electrode 5 arranged between the third connection electrode M3 and the fence F is connected with the first electrode 5 arranged in the subpixels 21, 22 and 23. Therefore, if the first electrode 5 is arranged near the first trench T1, this first electrode 5 may be provided to be disconnected from the first electrode 5 arranged in the subpixels 21, 22 and 23.

Consequently, the display device 1 according to one embodiment of the present disclosure may prevent a cathode voltage drop from occurring and easily apply the cathode voltage to the center of the substrate 2 by forming the first trench T1 between the pixel P and the adjacent pixel P and making the connection electrode M exposed from the first trench T1 be in contact with the second electrode 7, whereby a luminance difference between the outside of the substrate 2 and the center of the substrate 2 may be reduced.

Meanwhile, the display device 1 according to one embodiment of the present disclosure may reduce the number of manufacturing processes by forming the first trench T1 and the second trench T2 together. As shown in FIG. 1, the first trench T1 and the second trench T2 are provided to be connected with each other, whereby side leakage current may be prevented from occurring among the subpixels 21, 22 and 23 and a cathode voltage drop of the second electrode may be prevented from occurring. The first trench T1 according to one example may be arranged among four subpixels as shown in FIG. 1.

Referring to FIG. 3, the first electrode 5 is formed on the insulating layer 4 or the reflective panel RP. The first electrode 5 according to one example may be arranged between the reflective panel RP and the second electrode 7. In this case, the first electrode 5 may be formed of a transparent material such as ITO (indium tin oxide), which can transmit light between the reflective panel RP and the second electrode 7. The first electrode 5 may be an anode. The first electrode 5 may include a first sub electrode 51, a second sub electrode 52 and a third sub electrode 53.

The first sub electrode 51 may be provided in the first subpixel 21. The first sub electrode 51 may be arranged on the insulating layer 4. The first sub electrode 51 is connected to a source electrode of the first thin film transistor 31 through a contact electrode provided in a contact hole that partially exposes the first reflective panel RP1 arranged inside the insulating layer 4 and a contact hole formed in a portion of the circuit element layer 3.

The second sub electrode 52 may be provided in the second subpixel 22. The second sub electrode 52 may be arranged on the insulating layer 4. The second sub electrode 52 is connected to a source electrode of the second thin film transistor 32 through a contact electrode provided in a contact hole that partially exposes the second reflective panel RP2 arranged inside the insulating layer 4 to be located above the first reflective panel RP1 and a contact hole formed in a portion of the circuit element layer 3.

The third sub electrode 53 may be provided in the third subpixel 23. The third sub electrode 53 may be formed on the third reflective panel RP3. The third reflective panel RP3 may be arranged on the upper surface of the insulating layer 4 to be located above the second reflective panel RP2. The third sub electrode 53 is connected to a source electrode of the third thin film transistor 33 through a contact electrode provided in a contact hole that passes through the third reflective panel RP3 and the insulating layer 4 arranged on the lower surface of the third reflective panel RP3 and a contact hole formed in a portion of the circuit element layer 3.

In this case, the first to third thin film transistors 31, 32 and 33 may be N-type TFTs.

If the first to third thin film transistors 31, 32 and 33 are provided as P-type TFTs, each of the first to third sub electrodes 51, 52 and 53 may be connected to a drain electrode of each of the first to third thin film transistors 31, 32 and 33.

That is, each of the first to third sub electrodes 51, 52 and 53 may be connected to a source electrode or a drain electrode in accordance with types of the first to third thin film transistors 31, 32 and 33.

The display device 1 according to one embodiment of the present disclosure is provided in a top emission method, and each of the first to third sub electrodes 51, 52 and 53 may be made of a transparent electrode formed of a transparent conductive material. This is because that the first to third reflective panels RP1, RP2 and RP3 for reflecting light emitted from the organic light emitting layer 6, progressing to the lower portion toward the second electrode 7 are arranged at the lower portion of the first to third sub electrodes 51, 52 and 53.

The first reflective panel RP1 provided in the first subpixel 21, the second reflective panel RP2 provided in the second subpixel 22 and the third reflective panel RP3 provided in the third subpixel 23 may be formed of the substantially same material to have the substantially same thickness.

Referring to FIG. 3 again, the fence F may be provided to cover edges of the first electrode 5. In more detail, the fence F may be provided to cover sides of the first sub electrode 51 and a portion of an upper surface of the first sub electrode 51, cover sides of the second sub electrode 52 and a portion of an upper surface of the second sub electrode 52 and cover sides of the third sub electrode 53 and a portion of an upper surface of the third sub electrode 53. Therefore, the fence F may partition the first subpixel 21, the second subpixel 22 and the third subpixel 23 from one another.

In one embodiment, the fence F serves to define the subpixels, that is, a light emitting portion. Also, since an area where the fence F is formed does not emit light, the area may be referred to as a non-light emitting portion. The fence F may be formed of any one or more of acryl resin, epoxy resin, phenolic resin, polyamide resin, and polyimide resin, or the like. Other suitable materials may be utilized besides the aforementioned resins. The organic light emitting layer 6 is formed on the first electrode 5 and the fence F.

The second trench T2 may be arranged between fences F arranged in a portion where the first subpixel 21, the second subpixel 22 and the third subpixel 23 are adjacent to one another. That is, the second trench T2 may be provided in a boundary area between the first subpixel 21 and the second subpixel 22 and a boundary area between the second subpixel 22 and the third subpixel 23. The second trench T2 may be formed between long sides of the first electrode 5 as shown in FIG. 1.

The second trench T2 is formed in the insulating layer 4 in a recessed structure. In one embodiment, the second trench T2 prevents a side leakage current from occurring by making a length of a current path be long through the organic light emitting layer 6 among the adjacent subpixels 21, 22 and 23 or partially disconnecting the organic light emitting layer 6. The second trench T2 may be formed in, but not limited to, the insulating layer. The second trench T2 may be formed to be extended to the inside of the circuit element layer 3 below the insulating layer 4. Like the first trench T1, the side of the second trench T2 may be formed to be inclined.

The organic light emitting layer 6 is formed on the first electrode 5. The organic light emitting layer 6 is also formed on the fence F and also formed on the insulating layer 4 arranged in the boundary area among the plurality of subpixels 21, 22 and 23.

The organic light emitting layer 6 may be provided to emit white (W) light. To this end, the organic light emitting layer 6 may include a plurality of stacks emitting light of different colors. In detail, the organic light emitting layer 6 may include a first stack 61, a second stack 63 and a charge generation layer (CGL) 62 provided between the first stack 61 and the second stack 63.

The first stack 61 is provided on the first electrode 5, and may be formed of a deposited structure of a hole injecting layer HIL, a hole transporting layer HTL, a blue (B) emitting layer EML(B) and an electron transporting layer ETL, which are deposited in due order.

The charge generation layer (CGL) 62 serves to supply charges to the first stack 61 and the second stack 63. The charge generation layer (CGL) 62 may include an N type charge generation layer for supplying electrons to the first stack 61 and a P type charge generation layer for supplying holes to the second stack 63. The N type charge generation layer may include a metal material as a dopant.

The second stack 63 is provided on the first stack 61, and may be formed of a deposited structure of a hole transporting layer HTL, a yellow green (YG) emitting layer EML(YG), an electron transporting layer ETL and an electron injecting layer EIL, which are deposited in due order.

The organic light emitting layer 6 is also formed inside and above the second trench T2. According to one embodiment of the present disclosure, as the organic light emitting layer 6 is partially formed inside the second trench T2, a long current path between the adjacent subpixels 21, 22 and 23 is formed, whereby resistance may be increased and therefore occurrence of a leakage current may be reduced.

Particularly, referring to a portion enlarged by an arrow in FIG. 3, the first stack 61 is formed at a side inside the second trench T2, and may also be formed on a lower surface inside the second trench T2. At this time, a portion of the first stack 61 formed at the side inside the second trench T2 and a portion of the first stack 61 formed on the lower surface inside the second trench T2 are disconnected from each other without being connected with each other. Therefore, one side inside the second trench T2, for example, a portion of the first stack 61 formed at a left side and another side inside the second trench T2, for example, a portion of the first stack 61 formed at a right side are disconnected from each other without being connected with each other. Therefore, charges cannot move through the first stack 61 among the subpixels 21, 22 and 23 arranged to adjoin one another by interposing the second trench T2.

Also, the charge generation layer 62 may be formed on the first stack 61 at the side inside the second trench T2. At this time, one side inside the second trench T2, for example, a portion of the charge generation layer 62 formed at a left side and another side inside the second trench T2, for example, a portion of the charge generation layer 62 formed at a right side are disconnected from each other without being connected with each other. Therefore, charges cannot move through the charge generation layer 62 among the subpixels 21, 22 and 23 arranged to adjoin one another by interposing the second trench T2.

The second stack 63 may be provided on the charge generation layer 62. Also, the second stack 63 may be provided to be connected from each other without being disconnected with each other among the subpixels 21, 22 and 23 arranged to adjoin one another by interposing the second trench T2. Therefore, charges can move through the second stack 63 among the subpixels 21, 22 and 23 arranged to adjoin one another by interposing the second trench T2. However, without limitation to this example, a shape of the second trench T2 and a deposition process of the organic light emitting layer 6 may be controlled appropriately, whereby the second stack 63 may be provided to be disconnected among the subpixels 21, 22 and 23 arranged to adjoin one another by interposing the second trench T2.

Meanwhile, the charge generation layer 62 has conductivity greater than the first stack 61 and the second stack 63. Particularly, since the N type charge generation layer constituting the charge generation layer 62 may include a metal material, the N type charge generation layer has conductivity greater than the first stack 61 and the second stack 63. Therefore, charges mainly move through the charge generation layer 62 among the subpixels 21, 22 and 23 arranged to adjoin one another, and the moving amount of charges through the second stack 63 is insignificant. Therefore, according to one embodiment of the present disclosure, the charge generation layer 62 is provided to be disconnected inside the second trench T2, whereby movement of charges among the subpixels 21, 22 and 23 arranged to adjoin one another may be reduced to prevent a leakage current from occurring. Consequently, a portion of the organic light emitting layer 6 may be only disconnected in the second trench T2. Since the other portion of the organic light emitting layer 6 is not disconnected from the second trench T2, as shown in FIG. 3, the second electrode 7 may be arranged above the second stack 63 without being inserted into the second trench T2.

The second electrode 7 may serve as a cathode of the display device 1 of the present disclosure. The second electrode 7 is formed in each of the subpixels 21, 22 and 23 and among the subpixels 21, 22 and 23 in the same manner as the organic light emitting layer 6. The second electrode 7 is also formed between the pixel P and the adjacent pixel P. Consequently, the second electrode 7 is on the entire surface of the substrate 2 as a common layer. The second electrode 7 is connected to the voltage supply arranged outside the substrate 2 and supplied with the cathode voltage from the voltage supply, whereby the first electrode 5 and an electric field may be formed in the subpixels 21, 22 and 23 owned by each of the plurality of pixels P.

Since the display device 1 according to one embodiment of the present disclosure is provided in a top emission method and has a microcavity structure, the second electrode 7 may be made of a semi-transparent electrode and therefore light extraction effect based on the microcavity may be obtained per subpixels 21, 22 and 23.

In brief, the second electrode 7, as shown in FIG. 3, may be arranged above the organic light emitting layer 6 without being inserted into the second trench T2. This is because that a portion of the organic light emitting layer 6 is only disconnected from the second trench T2 arranged in the boundary area among the first subpixel 21, the second subpixel 22 and the third subpixel 23. That is, as shown in FIG. 3, since the second stack 63 is connected even in the boundary area among the first to third subpixels 21, 22 and 23, the second electrode 7 is not inserted into the second trench T2.

The reason why the second stack 63 may be connected among the first to third subpixels 21, 22 and 23 is that a width W2 (shown in FIG. 3) of the second trench T2 is formed to be narrower than the width W1 (shown in FIG. 2) of the first trench T1. The reason why the width W2 of the second trench T2 is formed to be narrower than that of the first trench T1 is that the first trench T1 contacts the second electrode 7 with at least one of the plurality of connection electrodes M by allowing the second electrode 7 to be arranged inside the first trench T1 by disconnecting the organic light emitting layer 6, whereas the second trench T2 does not need to insert the second electrode 7 into the second trench T2. Therefore, since the interval among the first to third subpixels 21, 22 and 23 provided with the second trench T2 may be narrower than the interval between the pixels P, it may be more favorable to embody high resolution.

Consequently, the second electrode 7 may be in contact with the auxiliary electrode AE to reduce a luminance difference between the outside of the substrate 2 and the center of the substrate 2. Further, the first trench T1 may be provided to be wider than the second trench T2. Since the cathode voltage drop of the second electrode 7 may be avoided by the first trench T1, the second trench T2 does not need to be provided at the same width as that of the first trench T1 and may be provided to be narrower than the first trench T1, whereby the interval among the subpixels 21, 22 and 23 may be reduced to embody high resolution more easily.

The width W1 of the first trench T1 according to one example may be 0.15 μm or more and 0.2 μm or less. If the width of the first trench T1 is less than 0.15 μm, the organic light emitting layer 6 is not fully disconnected, whereby the second electrode 7 is not inserted into the first trench T1 and therefore the second electrode 7 is not in contact with at least one of the plurality of connection electrodes M. For this reason, the cathode voltage drop occurs toward the center of the substrate 2 and therefore a luminance difference between the outside of the substrate 2 and the center of the substrate 2 may occur. If the width of the first trench T1 exceeds 0.2 μm, a portion of the organic light emitting layer 6 covers both a left side and a right side of the first trench T1, whereby the second electrode 7 may not be in contact with at least one of the plurality of connection electrodes M. Therefore, in the display device 1 according to one embodiment of the present disclosure, the width W1 of the first trench T1 is provided to be 0.15 μm or more and 0.2 μm or less and therefore the second electrode 7 is inserted into the first trench T1, whereby the second electrode 7 may be in contact with at least one of the plurality of connection electrodes M and therefore may be applied with the cathode voltage from the auxiliary electrode AE.

Meanwhile, the depth D1 (shown in FIG. 2) of the first trench T1 according to one example may be 0.2 μm or more and 0.4 μm or less. If the depth of the first trench T1 is less than 0.2 μm, a portion of the organic light emitting layer 6 covers all of the plurality of connection electrodes M exposed to the first trench T1 and therefore the second electrode 7 may not be in contact with at least one of the plurality of connection electrodes M. For another example, if the depth of the first trench T1 is less than 0.2 μm, a portion of the organic light emitting layer 6 covers the third connection electrode M3 and the second connection electrode M2 and the first connection electrode M1 is not exposed from the insulating layer 4, whereby the second electrode 7 may not be in contact with at least one of the plurality of connection electrodes M. Consequently, if the depth of the first trench T1 is less than 0.2 μm, the second electrode 7 may not be in contact with at least one of the plurality of connection electrodes M. If the depth D1 of the first trench T1 exceeds 0.4 μm, the auxiliary electrode AE may be etched when the first trench T1 is formed, whereby a thickness of the auxiliary electrode AE may become thin or be disconnected. For this reason, since resistance of the auxiliary electrode AE is increased, a cathode voltage drop prevention ratio through the auxiliary electrode AE becomes small or the cathode voltage drop not be prevented from occurring. Therefore, in the display device 1 according to one embodiment of the present disclosure, as the depth D1 of the first trench T1 may be provided to be 0.2 μm or more and 0.4 μm or less, the auxiliary electrode AE may be prevented from being damaged and at least one of the plurality of connection electrodes M may be exposed from the organic light emitting layer 6 or the insulating layer 4, whereby the second electrode 7 may be in contact with at least one of the plurality of connection electrodes M and therefore may be applied with the cathode voltage from the auxiliary electrode AE.

As described above, since the second trench T2 is formed to be narrower than the first trench T1, the depth D2 of the second trench T2 may be provided to be lower than the depth D1 of the first trench T1.

Referring to FIG. 3 again, the encapsulation layer 8 may be formed on the second electrode 7. In one embodiment, the encapsulation layer 8 serves to prevent oxygen or water from being permeated into the organic light emitting layer 6 and the second electrode 7. To this end, the encapsulation layer 8 may include at least one inorganic film and at least one organic film.

For example, the encapsulation layer 8 may include a first inorganic film, an organic film, and a second inorganic film. In this case, the first inorganic film is formed to cover the second electrode 7. The organic film is formed to cover the first inorganic film. It is preferable that the organic film is formed at a length long enough to prevent particles from being permeated into the organic light emitting layer 6 and the second electrode 7 by passing through the first inorganic film. The second inorganic film is formed to cover the organic film.

Figure 4:
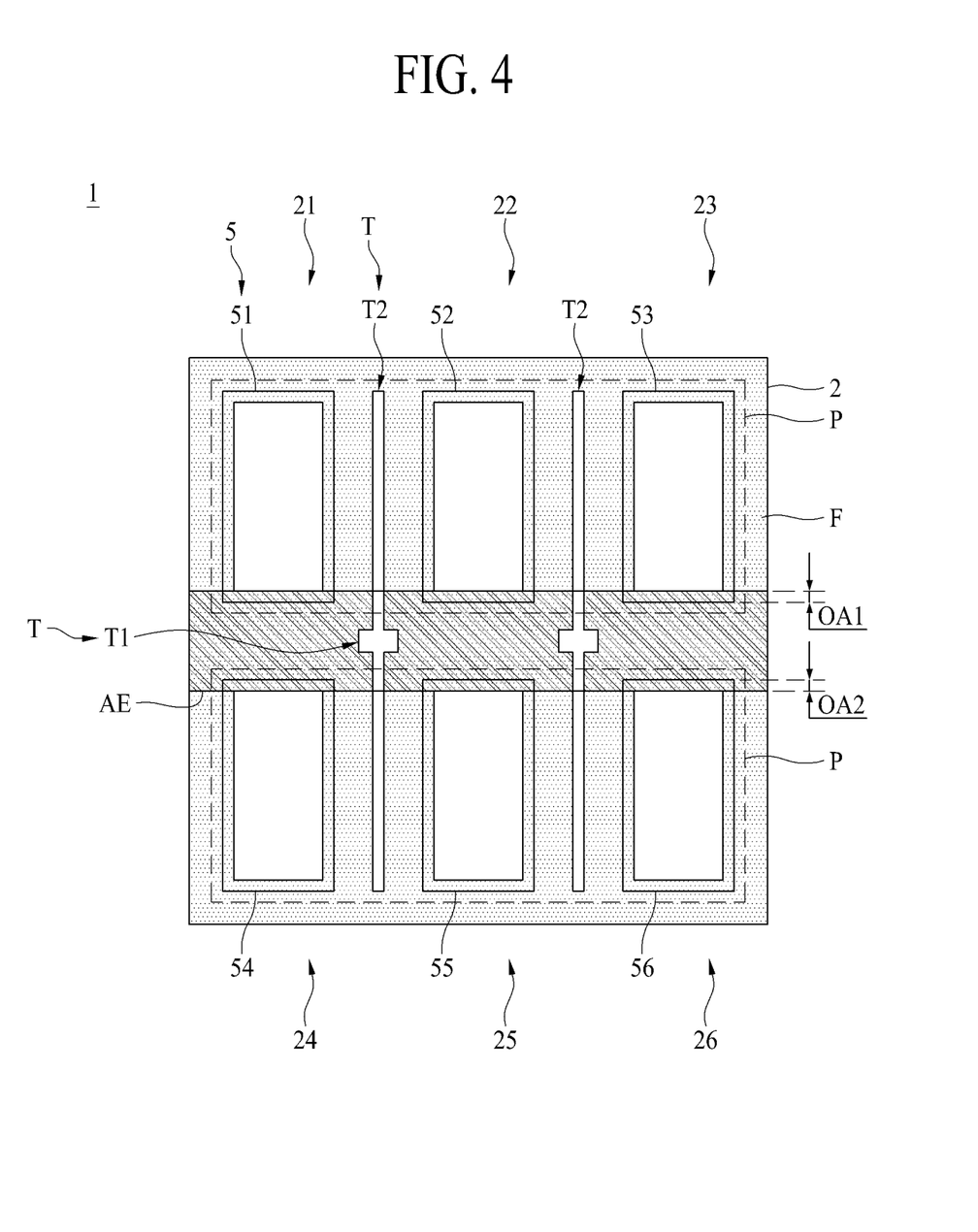
FIG. 4 is a plane view illustrating another example of an auxiliary electrode of a display device according to one or more embodiments of the present disclosure.

FIG. 4 is a plane view illustrating another example of an auxiliary electrode of a display device according to one or more embodiments of the present disclosure.

Referring to FIG. 4, a portion of the auxiliary electrode AE may be provided to overlap the pixel P. That is, as the auxiliary electrode AE is provided to be wider than that of FIG. 1, one side of the auxiliary electrode AE may be overlapped with the pixel P and the other side of the auxiliary electrode AE may be overlapped with another pixel P adjacent to the above pixel P. Therefore, as shown in FIG. 4, the auxiliary electrode AE may include a first overlap area OA1 overlapped with the pixel P arranged at an upper side, and a second overlap area OA2 overlapped with the pixel arranged at a lower side.

In more detail, the pixel P arranged at the upper side based on FIG. 4 may include a first subpixel 21, a second subpixel 22 and a third subpixel 23, each of which may include a first sub electrode 51, a second sub electrode 52 and a third sub electrode 53. The pixel P arranged at the lower side based on FIG. 4 may include a fourth subpixel 24, a fifth subpixel 25 and a sixth subpixel 26, each of which may include a fourth sub electrode 54, a fifth sub electrode 55 and a sixth sub electrode 56. The pixel P arranged at the lower side based on FIG. 4 may be the pixel P located in a third direction vertical to each of a first direction and a second direction based on the pixel arranged at the upper side.

One side of the auxiliary electrode AE may be overlapped with a fence F arranged from the first subpixel 21 to the fourth subpixel 24, and the first sub electrode 51 overlapped with the fence F. In this case, one side of the auxiliary electrode AE may also be overlapped with the first reflective panel RP1 overlapped with the fence F.

Also, one side of the auxiliary electrode AE may be overlapped with a fence F arranged from the second subpixel 22 to the fifth subpixel 25, and the second sub electrode 52 overlapped with the fence F. In this case, one side of the auxiliary electrode AE may also be overlapped with the second reflective panel RP2 overlapped with the fence F.

Also, one side of the auxiliary electrode AE may be overlapped with a fence F arranged from the third subpixel 23 to the sixth subpixel 26, and the third sub electrode 53 overlapped with the fence F. In this case, one side of the auxiliary electrode AE may also be overlapped with the third reflective panel RP3 overlapped with the fence F.

Meanwhile, the other side of the auxiliary electrode AE may be overlapped with a fence F arranged from the fourth subpixel 24 to the first subpixel 21, and the fourth sub electrode 54 overlapped with the fence F. In this case, the other side of the auxiliary electrode AE may also be overlapped with a fourth reflective panel (not shown) overlapped with the fence F.

Also, the other side of the auxiliary electrode AE may be overlapped with a fence F arranged from the fifth subpixel 25 to the second subpixel 22, and the fifth sub electrode 55 overlapped with the fence F. In this case, the other side of the auxiliary electrode AE may also be overlapped with a fifth reflective panel (not shown) overlapped with the fence F.

Also, the other side of the auxiliary electrode AE may be overlapped with a fence F arranged from the sixth subpixel 26 to the third subpixel 23, and the sixth sub electrode 56 overlapped with the fence F. In this case, the other side of the auxiliary electrode AE may also be overlapped with a sixth reflective panel (not shown) overlapped with the fence F.

However, without limitation to this case, one side of the auxiliary electrode AE may be overlapped with a portion of a light emitting area of the first subpixel 21, the second subpixel 22 and the third subpixel 23, and the other side of the auxiliary electrode AE may be overlapped with a portion of a light emitting area of the fourth subpixel 24, the fifth subpixel 25 and the sixth subpixel 26.

Since the auxiliary electrode AE is arranged below the insulating layer 4, even though the auxiliary electrode AE is overlapped with the pixel P, the auxiliary electrode AE may not interfere with a user who views an image. Since a resistance value of the auxiliary electrode AE is more lowered if a width of the auxiliary electrode AE becomes wide, the cathode voltage may be applied to the second electrode 7 located at the center of the substrate 2 more easily.

The auxiliary electrode AE may be provided to be arranged among the plurality of pixels P or between two pixels P. If the auxiliary electrode AE is arranged among the plurality of pixels P, that is, if each of the pixels P is matched with the auxiliary electrode AE at a ratio of 1:1 or 1:2, the cathode voltage is applied to each pixel P through the auxiliary electrode AE, whereby a luminance difference between the outside of the substrate 2 and the center of the substrate 2 may be more reduced. On the other hand, if the auxiliary electrode AE is provided to be arranged between two pixels P, that is, if two pixels P share one auxiliary electrode AE, the cathode voltage may not be applied to each pixel P more easily than the case that the auxiliary electrode AE is arranged among the pixels P, but the interval between the pixels where the auxiliary electrode AE is not arranged may be reduced, whereby it may be favorable to embody high resolution.

Figure 5:
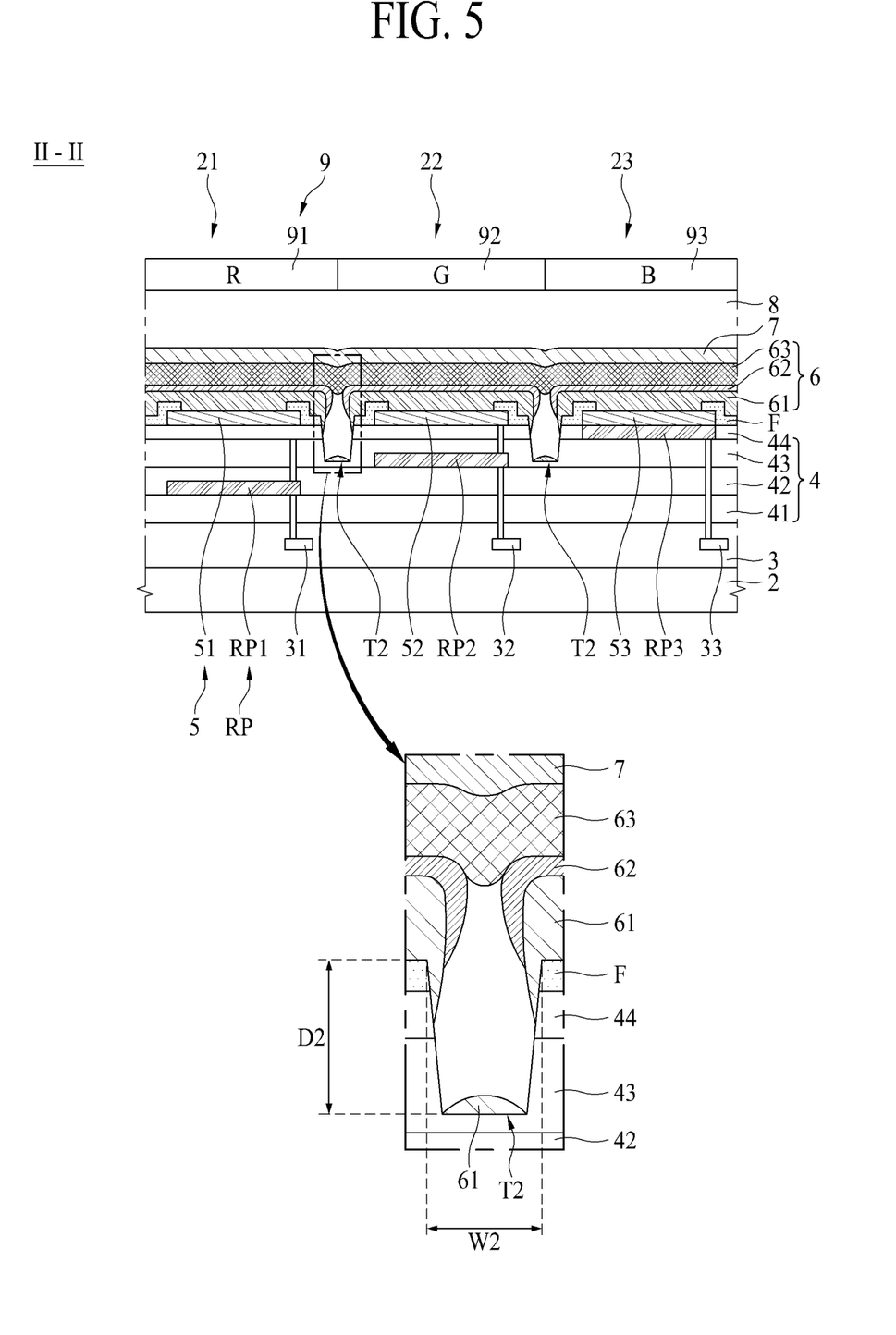
FIG. 5 is a cross-sectional view illustrating a display device according to another embodiment of the present disclosure.

FIG. 5 is a cross-sectional view taken along a direction same as the direction of line II-II shown in FIG. 1 illustrating a display device according to another embodiment of the present disclosure.

Referring to FIG. 5, the display device 1 according to another embodiment of the present disclosure is the substantially same as the display device based on FIG. 3 except that a color filter layer 9 is provided on the encapsulation layer 8 of each of the first subpixel 21, the second subpixel 22 and the third subpixel 23. Therefore, the same reference numerals will be given to the same elements, and different elements will be mainly described hereinafter.

In case of the display device based on FIG. 3, as the spaced distance between the second electrode 7 and the reflective panel RP is varied per first to third subpixels 21, 22 and 23, red light is emitted from the first subpixel 21, green light is emitted from the second subpixel 22, and blue light is emitted from the third subpixel 23. That is, the display device based on FIG. 3 improves light extraction efficiency of different colors per subpixels 21, 22 and 23 by using the microcavity effect.

On the other hand, in case of the display device according to another embodiment of FIG. 5, the color filter layer 9 is arranged on the encapsulation layer 8, whereby a problem of a color viewing angle of light emitted from each of the subpixels 21, 22 and 23 may be solved. In more detail, since the display device based on FIG. 3 is provided to emit light of different colors per subpixels 21, 22 and 23 by using the microcavity structure without a color filter, a distance between the second electrode 7 and the reflective panel RP in a vertical direction per subpixel may be formed differently from a distance between the second electrode 7 and the reflective panel RP in a diagonal direction. For example, a distance SD1 between the second electrode 7 and the first reflective panel RP1 in a vertical direction from the first subpixel 21 to an upper surface of the reflective panel RP is shorter than a distance between the second electrode 7 and the first reflective panel RP1 in an inclined direction not the direction vertical to the upper surface of the reflective panel RP. Therefore, a user located in the vertical direction may view a red color, whereas a user located in the inclined direction may view another color not the red color. Consequently, in case of the display device based on FIG. 3, a problem of a color viewing angle may occur in that different colors may be seen to a user depending on a position where the user views subpixel, that is, a viewing angle.

However, in case of the display device according to another embodiment of FIG. 5, the color filter layer 9 is provided on the encapsulation layer 8, whereby the problem of the color viewing angle may be solved. The color filter layer 9 of the display device according to another embodiment of FIG. 5 may include a first color filter 91 provided to correspond to the first subpixel 21, a second color filter 92 provided to correspond to the second subpixel 22, and a third color filter 93 provided to correspond to the third subpixel 23.

The first color filter 91 is to filter light of the other colors to emit only red (R) light, and may be a red color filter. Since the first color filter 91 is provided at a size corresponding to the first subpixel 21 and emits only red (R) light having light extraction efficiency improved by the microcavity effect from the first subpixel 21, even though the viewing angle is varied as described above, light of the other colors may be filtered by the first color filter 91, whereby the user may view only red light.

The second color filter 92 is to filter light of the other colors to emit only green (G) light, and may be a green color filter. Since the second color filter 92 is provided at a size corresponding to the second subpixel 22 and emits only green (G) light having light extraction efficiency improved by the microcavity effect from the second subpixel 22, even though the viewing angle is varied as described above, light of the other colors may be filtered by the second color filter 92, whereby the user may view only green light.

The third color filter 93 is to filter light of the other colors to emit only blue (B) light, and may be a blue color filter. Since the third color filter 93 is provided at a size corresponding to the third subpixel 23 and emits only blue (B) light having light extraction efficiency improved by the microcavity effect from the third subpixel 23, even though the viewing angle is varied as described above, light of the other colors may be filtered by the third color filter 93, whereby the user may view only blue light.

Consequently, in the display device 1 according to another embodiment of the present disclosure, as the color filter layer 9 is provided on the encapsulation layer 8 of each of the first subpixel 21, the second subpixel 22 and the third subpixel 23, the color filter layer 9 shields light of the other color emitted due to a distance difference between the second electrode 7 and the reflective panel RP depending on the viewing angle, whereby the problem of the color viewing angle may be solved.

Figure 6A:
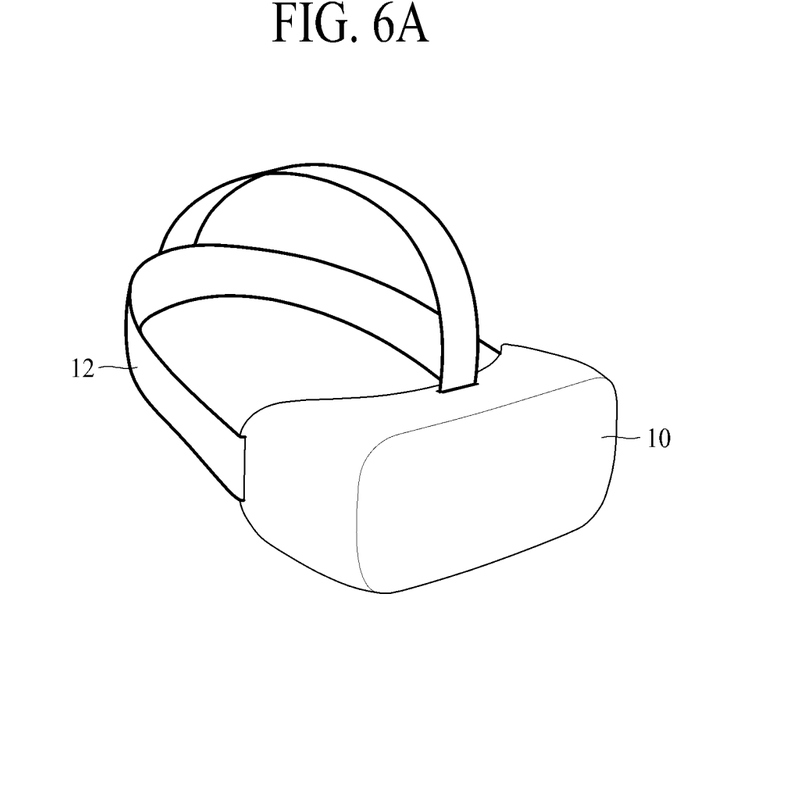
FIGS. 6A to 6C are views illustrating a display device according to other embodiments of the present disclosure, and relate to a head-mounted display (HMD) device.
Figure 6B:
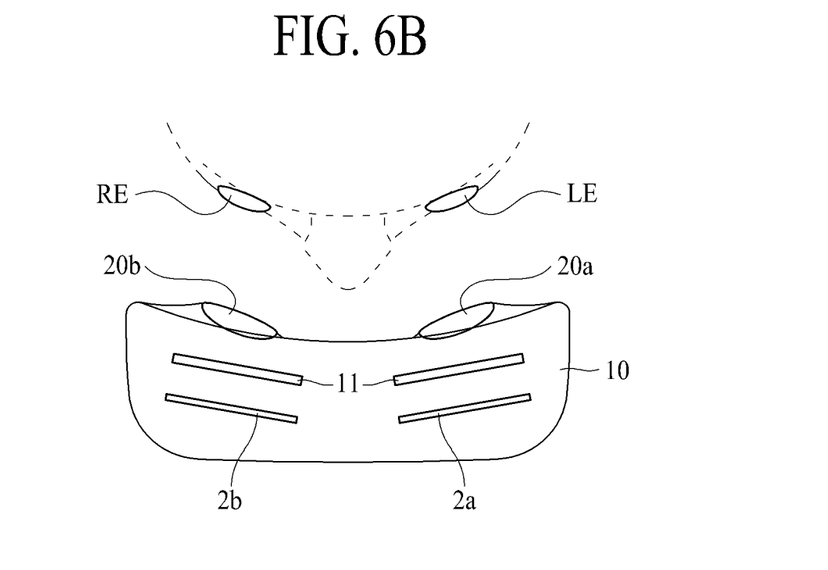
Figure 6C:
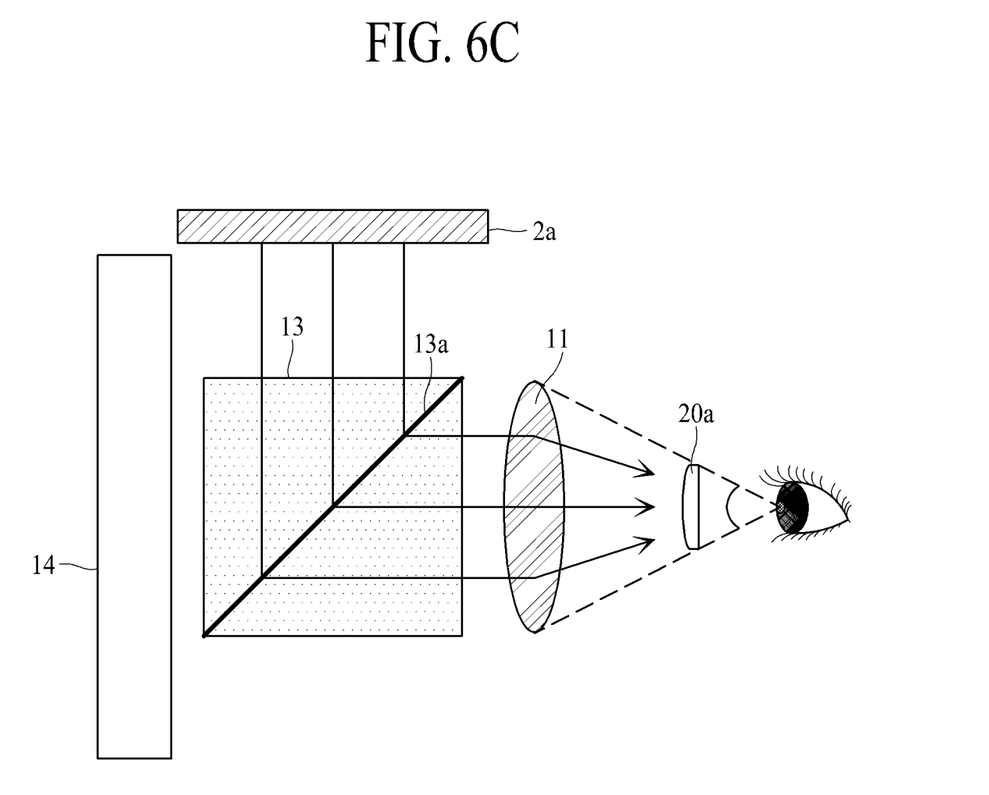

FIGS. 6A to 6C are views illustrating a display device according to other embodiments of the present disclosure and relate to a head mounted display (HMD) device. FIG. 6A is a perspective view, FIG. 6B is a plane view of a virtual reality (VR) structure, and FIG. 6C is a cross-sectional schematic view of an augmented reality (AR) structure.

As will be aware of it from FIG. 6A, a head mounted display device according to present disclosure comprises a storage case 10 and a head mounted band 12.

The storage case 10 stores elements such as a display device, a lens array, and an ocular lens therein.

The head mounted band 12 is removably attached to the storage case 10. The head mounted band 12 is formed to surround an upper surface and both sides of a user's head, but is not limited to this example. The head mounted band 12 is to fix a head mounted display device to a user's head. In other embodiments, the head mounted band 12 may be replaced with a structure of a shape of a glasses frame or a helmet shape.

As will be aware from FIG. 6B, the head mounted display device of a virtual reality (VR) structure according to the present disclosure may include a left eye display device 2a, a right eye display device 2b, a lens array 11, a left eye ocular lens 20a, and a right eye ocular lens 20b.

The left eye display device 2a, the right eye display device 2b, the lens array 11, the left eye ocular lens 20a and the right eye ocular lens 20b are stored in the storage case 10 described above.

The left eye display device 2a and the right eye display device 2b may display the substantially same image, and in this case, a user may view a 2D image. Alternatively, the left eye display device 2a may display a left eye image and the right eye display device 2b may display a right eye image, and in this case, a user may view a 3D image. Each of the left eye display device 2a and the right eye display device 2b may be comprised of a display device according to FIGS. 1 to 5 described above. For example, each of the left eye display device 2a and the right eye display device 2b may be an organic light emitting display device.

Each of the left eye display device 2a and the right eye display device 2b may include a plurality of subpixels, a circuit element layer 3, an insulating layer 4, an auxiliary electrode AE, a trench T, a reflective panel RP, a first electrode 5, a fence F, an organic light emitting layer 6, a second electrode 7, and an encapsulation layer 8, and may display various images by combining colors of light emitted from each of the subpixels in various manners.

The lens array 11 may be provided between the left eye ocular lens 20a and the left eye display device 2a by being spaced apart from each of the left eye ocular lens 20a and the left eye display device 2a. That is, the lens array 11 may be arranged in front of the left eye ocular lens 20a and behind the left eye display device 2a. Also, the lens array 11 may be provided between the right eye ocular lens 20b and the right eye display device 2b by being spaced apart from each of the right eye ocular lens 20b and the right eye display device 2b. That is, the lens array 11 may be arranged in front of the right eye ocular lens 20b and behind the right eye display device 2b.

In some embodiments, the lens array 11 may be a micro lens array. In other embodiments, the lens array 11 may be replaced with a pin hole array. Due to the lens array 11, images displayed on the left eye display device 2a or the right eye display device 2b may be viewed to be magnified to a user.

A left eye LE of a user may be arranged in the left eye ocular lens 20a, and a right eye RE of a user may be arranged in the right eye ocular lens 20b.

As will be aware from FIG. 6C, a head mounted display device of an AR structure according to the present disclosure includes a left eye display device 2a, a lens array 11, a left eye ocular lens 20a, a transmissive reflection portion 13, and a transmissive window 14. Although only a structure for a left eye is shown in FIG. 6C for convenience, a structure for a right eye is the substantially same as the structure for the left eye.

The left eye display device 2a, the lens array 11, the left eye ocular lens 20a, the transmissive reflection portion 13, and the transmissive window 14 are stored in the aforementioned storage case 10.

The left eye display device 2a may be arranged at one side of the transmissive reflection portion 13, for example, at an upper side, without covering the transmissive window 14. Therefore, the left eye display device 2a may provide the transmissive reflection portion 13 with an image without covering an outer background viewed through the transmissive window 14.

The left eye display device 2a may be comprised of an organic display device according to FIGS. 1 to 5 described above. In this case, the top portion corresponding to the surface where images are displayed in FIGS. 1 to 5, for example, the encapsulation layer 8 or a color filter layer 9 faces the transmissive reflection portion 13.

The lens array 11 may be provided between the left eye ocular lens 20a and the transmissive reflection portion 13.

A left eye of a user is arranged in the left eye ocular lens 20a.

The transmissive reflection portion 13 is arranged between the lens array 11 and the transmissive window 14. The transmissive reflection portion 13 may include a reflective surface 13a which transmits a portion of light and reflects another portion of light. The reflective surface 13a is formed to allow an image displayed on the left eye display device 2a to proceed to the lens array 11. Therefore, a user may view all of images displayed on the left eye display device 2a and an outer background through the transmissive window 14. That is, since the user may view one image by overlapping background in reality with virtual images, augmented reality (AR) may be embodied.

The transmissive window 14 is arranged in front of the transmissive reflection portion 13.

It will be apparent to those skilled in the art that the present disclosure described above is not limited by the above-described embodiments and the accompanying drawings and that various substitutions, modifications, and variations can be made in the present disclosure without departing from the spirit or scope of the disclosure. Consequently, the scope of the present disclosure is intended to encompass all variations or modifications derived from the meaning, scope, and equivalent concept that fall within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate having thereon a plurality of pixels;
an auxiliary electrode on the substrate;
a first insulating layer on the auxiliary electrode;
a second insulating layer on the first insulating layer;
a first connection electrode on a first surface of the first insulating layer;
a second connection electrode on a second surface of the second insulating layer;
a first trench extending through the second insulating layer, the first connection electrode, and the second connection electrode; and
an organic light emitting layer on the second connection electrode,
a second electrode on the organic light emitting layer,
wherein a portion of the first connection electrode extends through the first insulation layer and electrically connects with the auxiliary electrode, and
wherein a portion of the second connection electrode extends through the second insulation layer and electrically connects with the first connection electrode.

2. The display device of claim 1,
wherein the second electrode covers surfaces of the first trench and contacts the first insulating layer, the second insulating layer, the first connection electrode, and the second connection electrode.

3. The display device of claim 2, further comprising:
a fence structure between the organic light emitting layer and the second connection electrode,
wherein a side surface of the fence structure contacts the organic light emitting layer.

4. The display device of claim 1, wherein the first surface of the first insulating layer includes an upper surface of the first insulating layer.

5. The display device of claim 1, wherein the second surface of the second insulating layer includes an upper surface of the second insulating layer.

6. A display device, comprising:
a substrate having thereon a plurality of pixels, each of the plurality of pixels including a first subpixel, a second subpixel, and a third subpixel arranged in a first direction and a fourth subpixel, a fifth subpixel, and a sixth subpixel arranged in the first direction, the fourth subpixel adjacent to the first subpixel in a second direction transverse to the first direction, the fifth subpixel adjacent to the second subpixel in the second direction, the sixth subpixel adjacent to the third subpixel in the second direction;
an auxiliary electrode on the substrate and extended along the first direction, the auxiliary electrode between the first and fourth subpixels, the second and fifth subpixels, and the third and sixth subpixels;
a trench having a first trench portion and a second trench portion, the first trench portion having a first trench width and the second trench portion having a second trench width, the first trench width in the first direction being greater than the second trench width in the first direction,
wherein the first trench portion fully overlaps the auxiliary electrode, and
wherein the second trench portion at least partially overlaps the auxiliary electrode and extends in the second direction.

7. The display device of claim 6, wherein the auxiliary electrode at least partially overlaps with the first, second, and third subpixels.

8. The display device of claim 7, wherein the auxiliary electrode at least partially overlaps with the fourth, fifth, and sixth subpixels.

* * * * *